(12) United States Patent
    Fu

(10) Patent No.: US 11,885,494 B2
(45) Date of Patent: Jan. 30, 2024

(54) SMART FUEL BURNING SYSTEM AND METHOD OF OPERATING SAME

(71) Applicant: Reecon North America LLC, Pittsburgh, PA (US)

(72) Inventor: Guohong Fu, Zhejiang (CN)

(73) Assignees: Reecon North America LLC, Pittsburgh, PA (US); Reecon M & E Co. LTD., Zhejiang (CN)

( * ) Notice: Subject to any disclaimer, the term of this patent is extended or adjusted under 35 U.S.C. 154(b) by 235 days.

(21) Appl. No.: 17/209,757

(22) Filed: Mar. 23, 2021

(65) Prior Publication Data

US 2022/0307690 A1    Sep. 29, 2022

Related U.S. Application Data

(63) Continuation of application No. 16/578,563, filed on Sep. 23, 2019, now abandoned, which is a
(Continued)

(51) Int. Cl.
| | |
|---|---|
| *F23N 1/02* | (2006.01) |
| *F23C 1/00* | (2006.01) |
| *F23N 5/00* | (2006.01) |
| *F23N 5/26* | (2006.01) |
| *F23D 14/10* | (2006.01) |

(Continued)

(52) U.S. Cl.
CPC ............... *F23N 1/025* (2013.01); *F23C 1/00* (2013.01); *F23D 14/10* (2013.01); *F23N 5/00* (2013.01); *F23N 5/265* (2013.01); *F23N 2223/44* (2020.01); *F23N 2227/02* (2020.01); *F23N 2227/24* (2020.01); *F23N 2227/36* (2020.01); *F23N 2229/00* (2020.01); *F23N 2235/14* (2020.01); *F23N 2235/18* (2020.01); *F23N 2239/00* (2020.01); *F23N 2900/05005* (2013.01); *H05K 1/18* (2013.01); *H05K 2201/10128* (2013.01); *H05K 2201/10219* (2013.01); *H10N 10/13* (2023.02)

(58) Field of Classification Search
CPC ............. F23C 1/00; F23D 14/10; F23N 5/102
USPC .......................................... 431/59, 278, 281
See application file for complete search history.

(56) References Cited

U.S. PATENT DOCUMENTS

| | | |
|---|---|---|
| 3,167,248 A | 1/1965 | Douglas |
| 3,171,468 A | 2/1965 | Sparrow |

(Continued)

*Primary Examiner* — Vivek K Shirsat
(74) *Attorney, Agent, or Firm* — Nelson Mullins Riley & Scarborough LLP

(57) ABSTRACT

A system configured to generate heat when supplied with a first fuel or a second fuel can include a fuel supply line operatively connected to a fuel source. A valve assembly can be operatively connected to the fuel supply line. A main burner can be operatively connected to the valve assembly. A thermoelectric generating system can be configured to transform heat to electricity. A first pilot burner can include at least one of a first thermocouple and a first Fe-ion sensor. A second pilot burner can include at least one of a second thermocouple and a second Fe-ion sensor. A printed circuit board (PCB) can be operatively connected to the valve assembly and the first and second pilot burners. The PCB can be configured to control operation of the valve assembly based on information received from at least one of the first and second pilot burners.

20 Claims, 14 Drawing Sheets

Related U.S. Application Data continuation of application No. 15/380,226, filed on Dec. 15, 2016, now Pat. No. 10,422,530.

(60) Provisional application No. 62/413,634, filed on Oct. 27, 2016.

(51) Int. Cl.
*H05K 1/18* (2006.01)
*H10N 10/13* (2023.01)

(56) References Cited

U.S. PATENT DOCUMENTS

| | | | |
|---|---|---|---|
| 4,589,260 A | | 5/1986 | Krockow |
| 5,020,988 A | | 6/1991 | Peterson |
| 10,422,530 B2 | * | 9/2019 | Fu .......................... F23N 5/102 |
| 2004/0096790 A1 | * | 5/2004 | Querejeta ............... F23N 5/242 |
| | | | 431/80 |
| 2013/0299022 A1 | | 11/2013 | Deng |
| 2014/0178548 A1 | * | 6/2014 | Drummond ........ A47J 27/21166 |
| | | | 220/573.1 |
| 2015/0338100 A1 | * | 11/2015 | Deng ...................... F23N 5/102 |
| | | | 431/59 |
| 2016/0305657 A1 | | 10/2016 | Fu |
| 2018/0017255 A1 | | 1/2018 | Fu |
| 2018/0119954 A1 | | 5/2018 | Fu |
| 2020/0018480 A1 | | 1/2020 | Fu |

\* cited by examiner

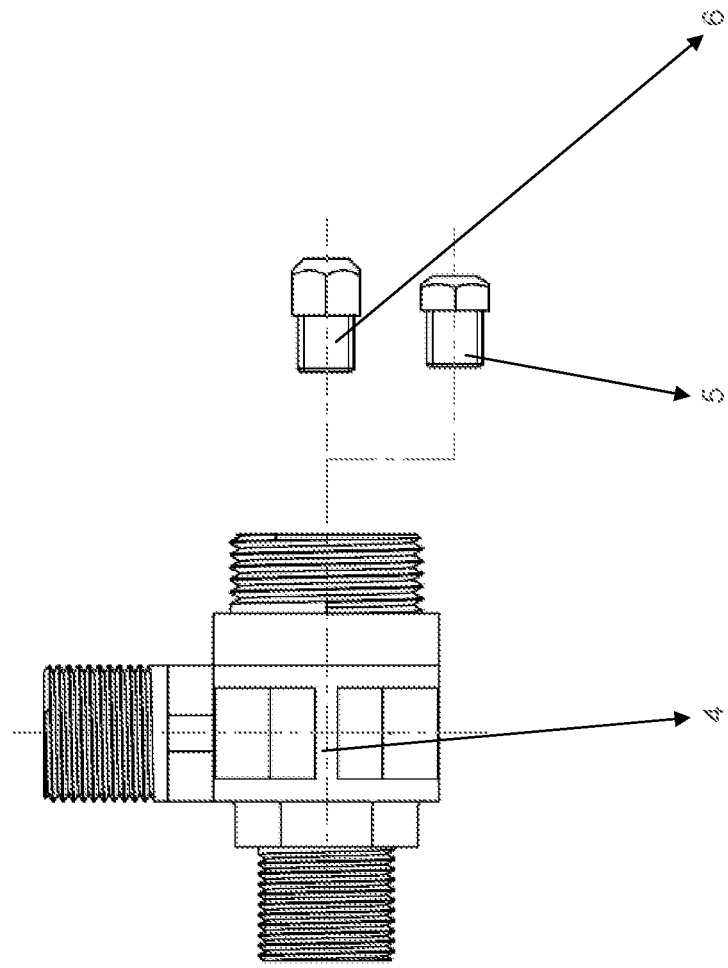
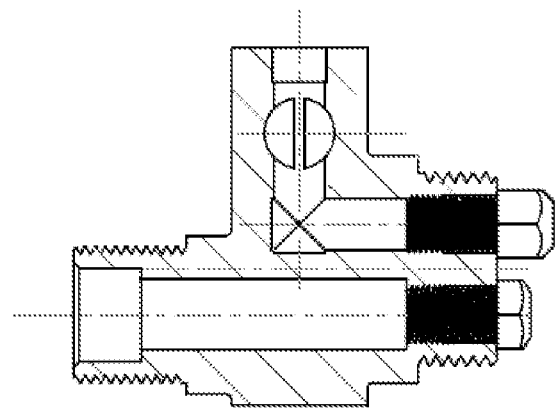
FIG. 7B
FIG. 7A

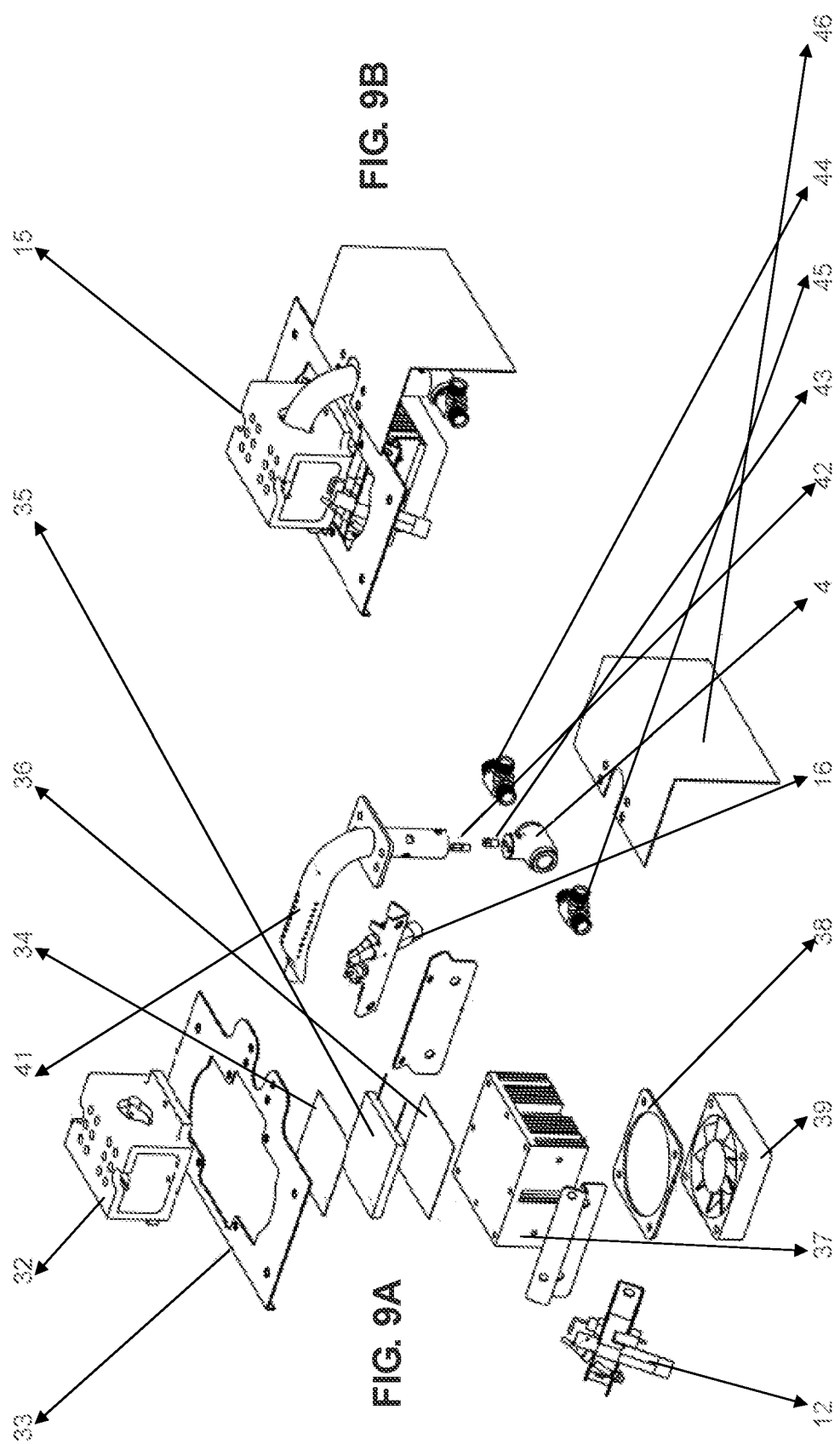

SMART FUEL BURNING SYSTEM AND METHOD OF OPERATING SAME

CROSS-REFERENCE TO RELATED APPLICATION

The present application is a continuation of U.S. patent application Ser. No. 16/578,563 filed on Sep. 23, 2019 and titled "Smart Gas Burning System and Method of Operating Same", which is a continuation of U.S. patent application Ser. No. 15/380,226 filed on Dec. 15, 2016 and titled "Smart Gas Burning System and Method of Operating Same", now U.S. Pat. No. 10,422,530 issued on Sep. 24, 2019, which claims priority to U.S. Provisional Patent Application No. 62/413,634, filed on Oct. 27, 2016 and titled "Smart Gas Burning System and Method of Operating Same".

SUMMARY

It is known to provide a gas burning apparatus that is capable of using more than one fuel to produce heat. These prior art devices, which may include vent-free and vented gas space heaters, gas cooking and grilling appliances, must be connected to an alternating current (AC) power supply in order to function as intended.

Due to the large thermal value different between different types of fuels, these prior art devices have either two different separate or independent systems, one to utilize each fuel type, or a gas distribution valve to identify fuel type and allocate fuel gas flow accordingly. Both prior art devices require manual operation in the ignition process and further visual observation on flames after ignition to confirm the appliances are run in proper configuration with different fuel types.

It would be desirable to overcome the above and other deficiencies of conventional gas burning devices. The system and method of the present disclosure provide such benefits.

In one embodiment, the present disclosure relates generally to a fuel burning system capable of generating heat when supplied with either a first fuel or a second fuel and/or detecting the supplied fuel source automatically (i.e., without any manual intervention).

The system of one embodiment of the presently disclosed technology can include at least one main burner. The at least one main burner can receive the fuel through at least one of a first nozzle or inlet and a second supplemental nozzle or inlet. A first pilot burner can include at least one thermocouple, and a second pilot burner that is spaced-apart from the first pilot burner can include at least one thermocouple. A combination valve assembly and a supply piping assembly can be configured to supply either the first fuel or the second fuel to the at least one main burner, the first pilot burner, the second pilot burner and the thermoelectric generating system burner. The thermocouples, the pilot burners, the thermoelectric generating system and/or the combination valve assembly can be connected with a main printed circuit board (PCB), which can be powered by either a direct current (DC) battery or a smart phone charger, but maintained by the thermoelectric generating system. The thermocouples can send feedback to the PCB, which can determine the inlet fuel type and can monitor the system's operation. The combination valve assembly can include at least two independent valves, which can be opened or closed to permit or prevent fuel (e.g., gas) flow to the main burner(s), pilot burners and thermoelectric generating system burner(s) according to the instructions received from the main PCB. A digital panel can be additionally wired or wirelessly connected with the PCB to display and/or control the operation of the system. An adapter could be additionally installed using surplus electricity from the thermoelectric generating system to operate other DC home appliance like smart phone, radio, etc.

In one embodiment, the system is a duel burning gas system that does not require a heat medium or one or more liquid cooling devices.

In one embodiment, the system uses one or more thermocouples and a printed circuit board to identify fuel type. In an embodiment with two sets of thermocouples, both can be energized by ignition, but each can have a different reaction to ignition. The difference can be detected (e.g., digitally) by the printed circuit board to determine which type or kind of fuel (e.g., gas) is being supplied and to control valves of the system accordingly.

In one embodiment, ignition can be powered by one or more rechargeable batteries, for example. In one embodiment, the battery(ies) can be drawn from for only a short period to keep valves in at least a partially open state and to keep the printed circuit board operating. After ignition, the system can keep the heater operating and rest or recharge the battery(ies). Thus, the system can be used to convert thermic energy to electric energy. In the event that the battery(ies) has died or has insufficient reserves to power ignition, the system can be started/ignited by a smart phone and/or a smart phone charger.

BRIEF DESCRIPTION OF THE SEVERAL VIEWS OF THE DRAWINGS

The foregoing summary, as well as the following detailed description of the presently disclosed technology, will be better understood when read in conjunction with the appended drawings. For the purpose of illustrating the presently disclosed technology, there are shown in the drawings various illustrative embodiments. It should be understood, however, that the presently disclosed technology is not limited to the precise arrangements and instrumentalities shown. In the drawings:

FIG. 7A is a side elevation view of a nozzle seat according to one embodiment of the presently disclosed technology;

FIG. 7B is a side elevation view of the nozzle shown in FIG. 7A;

FIG. 9A is a partially exploded view of a thermoelectric generating system of one embodiment of the presently disclosed technology;

FIG. 9B is a perspective view of an assembled thermoelectric generating system of FIG. 9A;

DETAILED DESCRIPTION

Figure 1A:
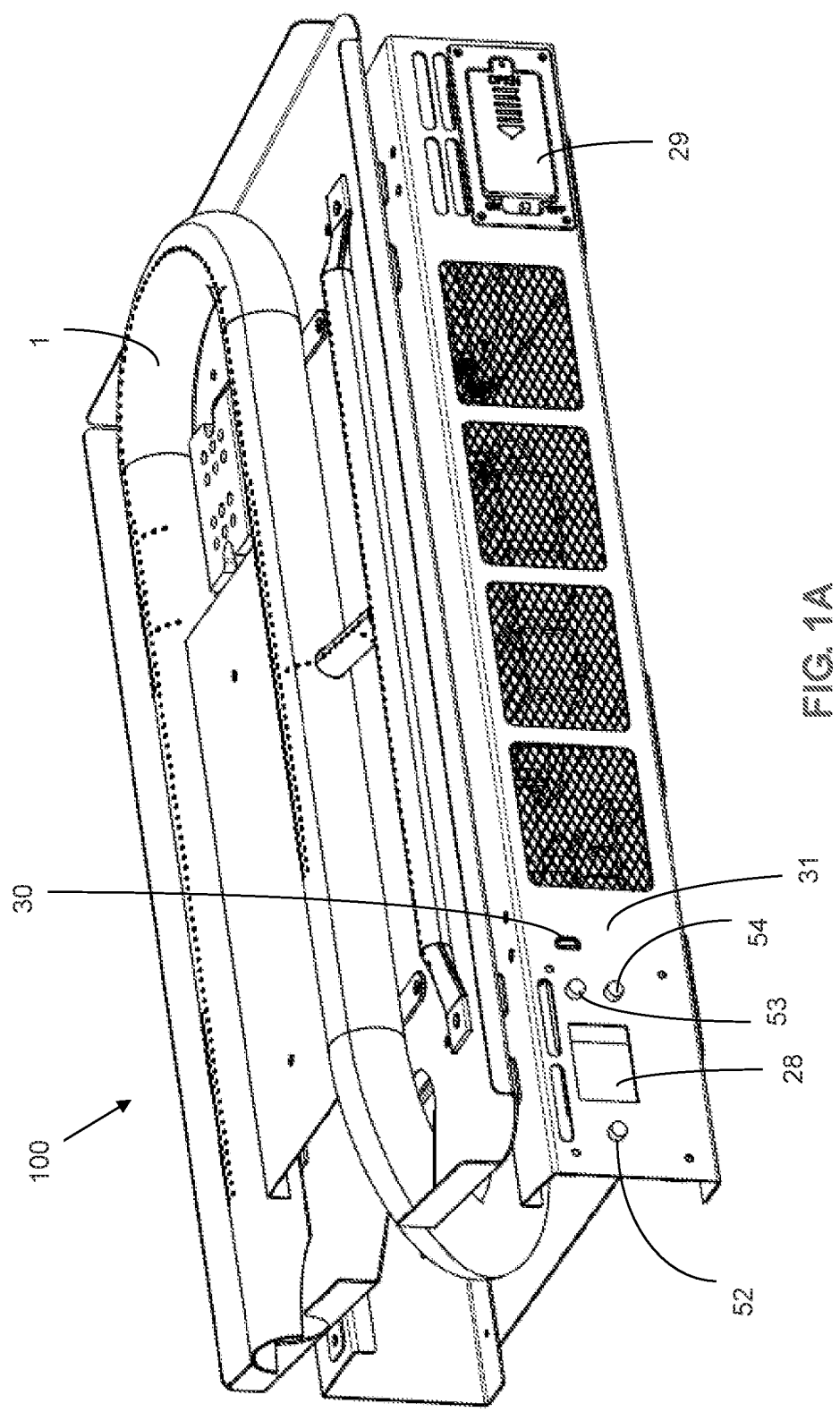
FIG. 1A is a perspective view of a fuel burning system in accordance with one embodiment of the presently disclosed technology.
Figure 1B:
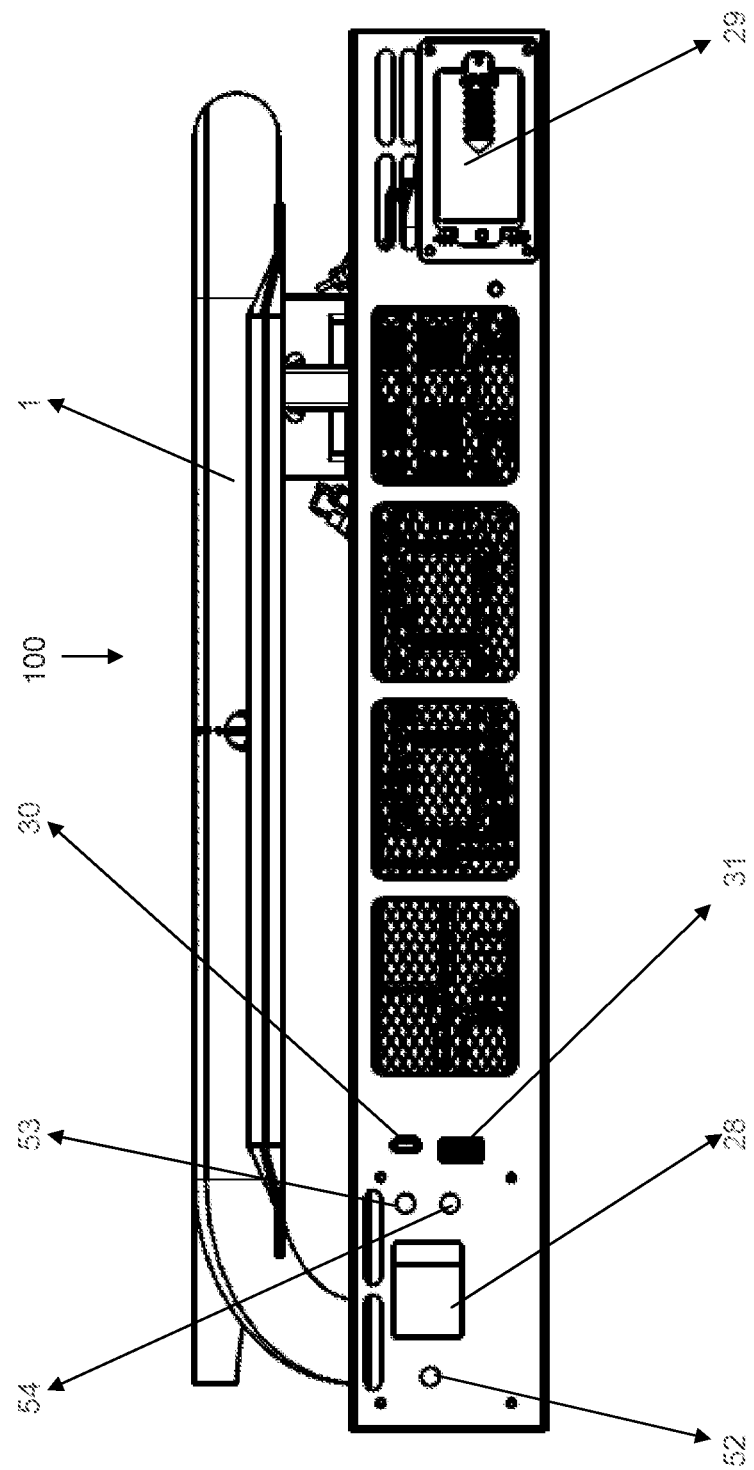
FIG. 1B is a front elevation view of the system shown in FIG. 1A.
Figure 2:
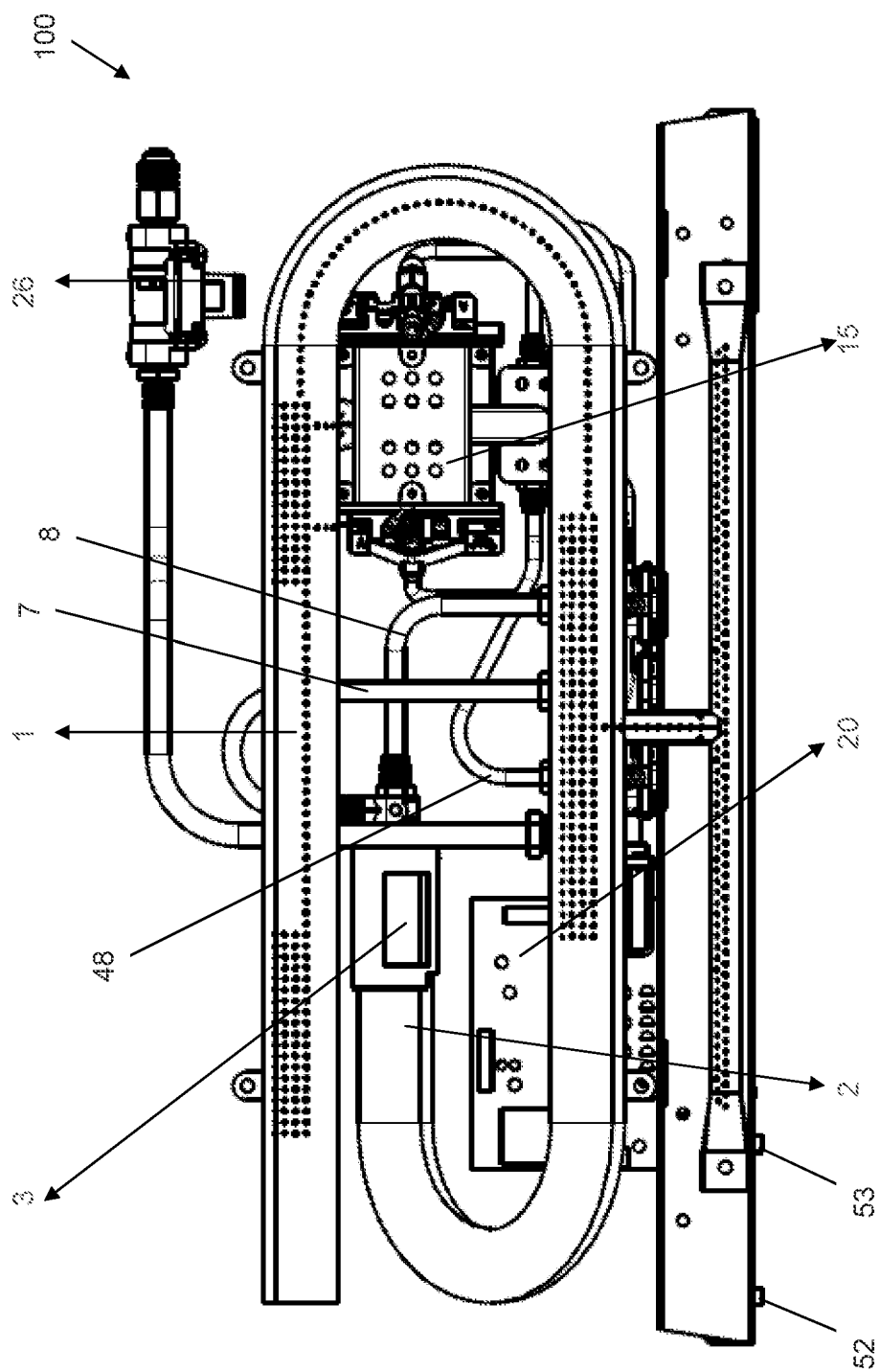
FIG. 2 is a top plan view of the system shown in FIG. 1A.
Figure 3:
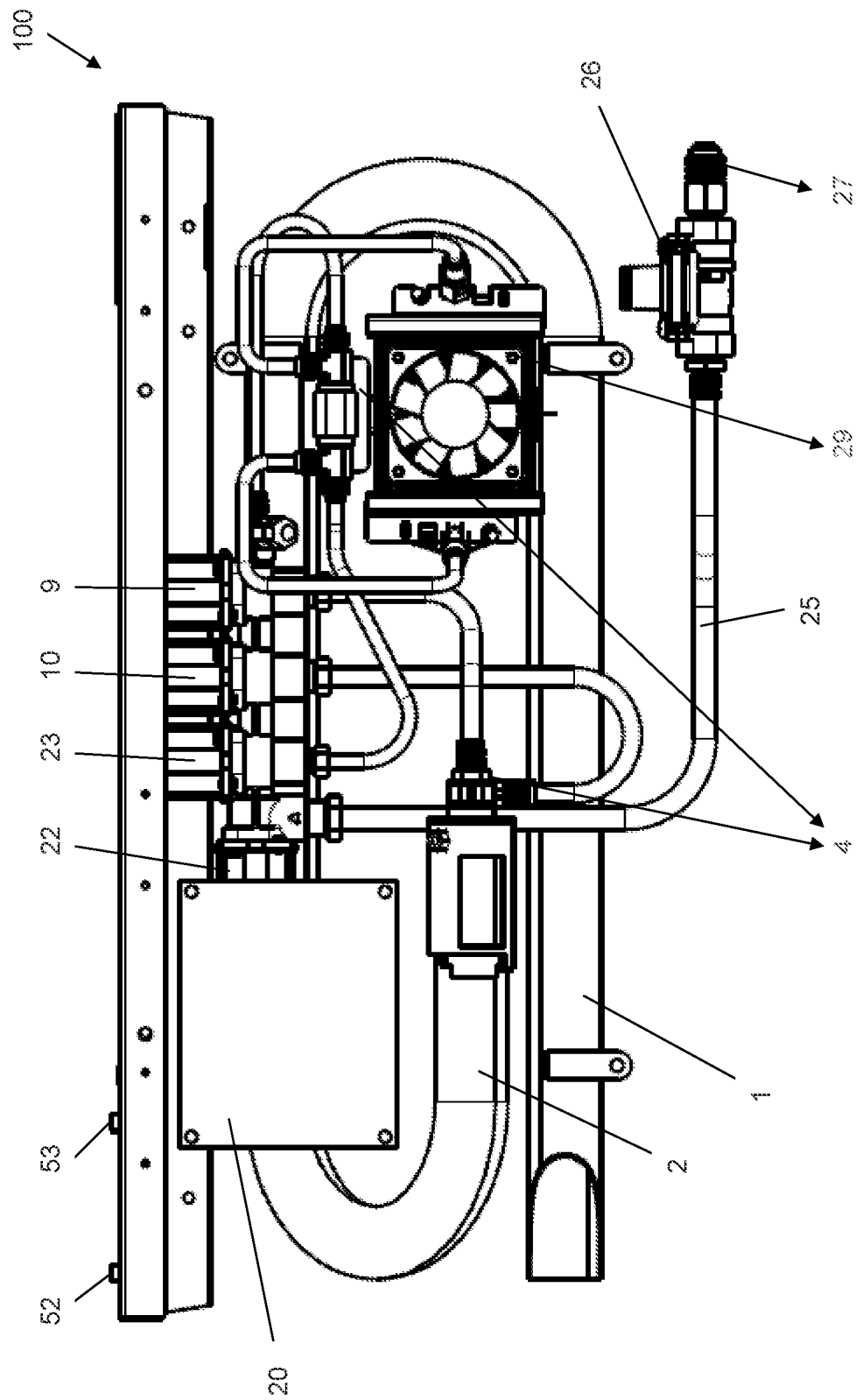
FIG. 3 is a bottom plan view of the system shown in FIG. 1A.

Certain terminology is used in the following description for convenience only and is not limiting. Certain words used herein designate directions in the drawings to which reference is made. Unless specifically set forth herein, the terms "a," "an" and "the" are not limited to one element, but instead should be read as meaning "at least one." The terminology includes the words noted above, derivatives thereof and words of similar import.

Referring to the drawings in detail, wherein like reference numerals indicate like elements throughout, FIGS. 1A-12 show one or more embodiments of a fuel or gas burning system, generally designated 100, capable of automatically detecting when either a first fuel or a second fuel is supplied or received, and generating heat from either or both of the fuels. For the sake of brevity and completeness, the disclosure of U.S. Publication No. 2016/0305657, titled "Heating System and Method of Operating Same," is herein incorporated by reference in its entirety. As described in detail below, the burning system 100 of the presently disclosed technology is configured to detect or identify the fuel type or source based upon inputs received from one or more sensors, such as thermocouples and Fe-ion sensors.

The first fuel can be of a different type or form than the second fuel, such that a difference in thermal or heating values exists between the two fuels. In one embodiment, the second fuel has a higher thermal value than the first fuel. For example, the first fuel can be natural gas and the second fuel can be propane, such as liquid propane. But the present disclosure is not limited to these two fuels. For example, the fuels can include any combination of liquid butane, liquefied petroleum gas (LPG), liquid gasoline, hydrogen, propane, carbon monoxide (CO) and the like. In at least one embodiment, the difference in thermal values can be relatively large, such as approximately 83,000 Btu/ft3. However, such a large different in thermo values between the two fuels is not required. Alternatively, the difference in thermo values between the two fuels can be greater than 83,000 Btu/ft3 or even significantly less.

Figure 6:
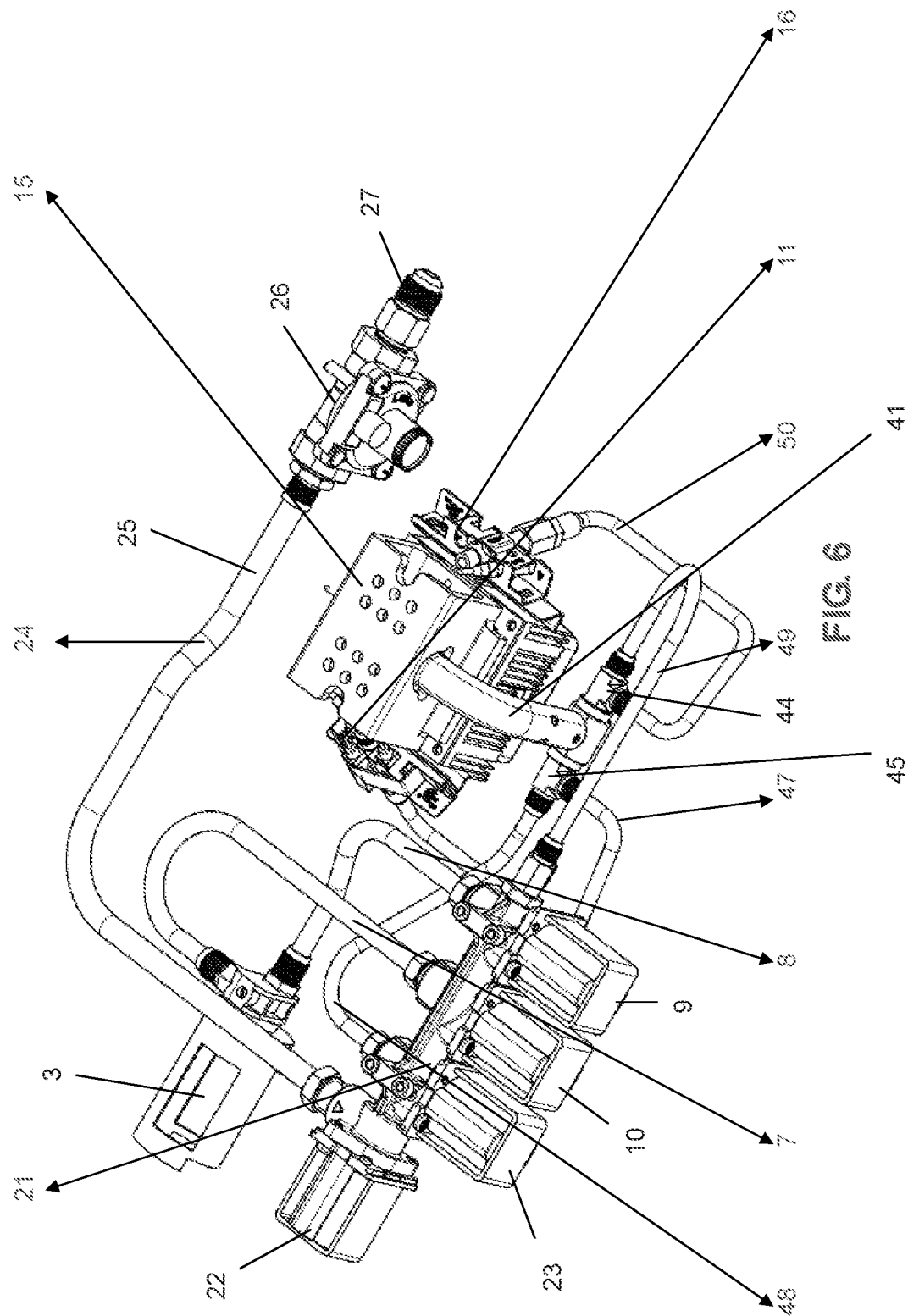
FIG. 6 is a top plan view of the piping arrangement shown in FIG. 5.
Figure 8A:
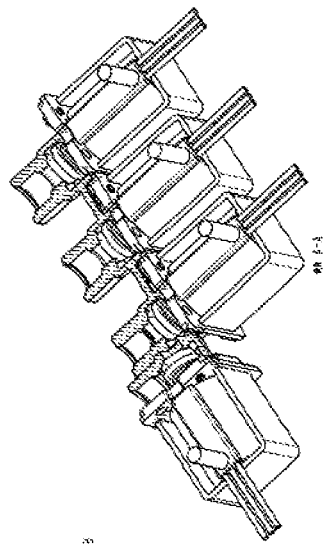
FIG. 8A is a front elevation view of a combination vale assembly according to one embodiment of the presently disclosed technology.
Figure 8B:
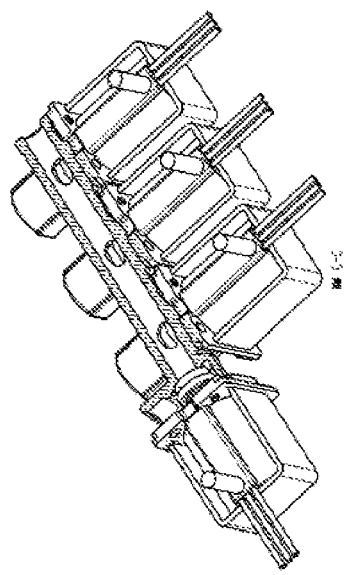
FIG. 8B is a perspective view of the combination vale assembly shown in FIG. 8A.
Figure 8C:
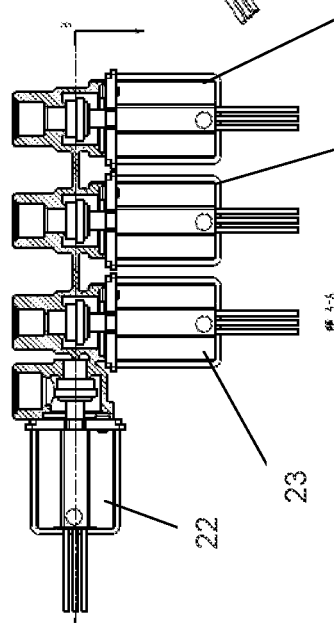
FIG. 8C is a top plan view of the combination vale assembly shown in FIG. 8A.
Figure 8D:
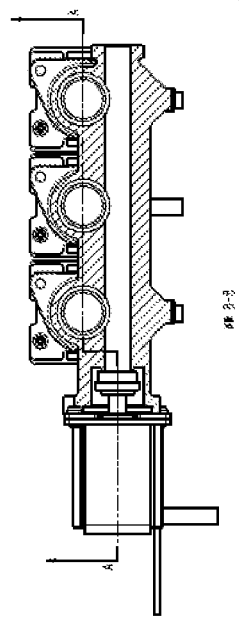
FIG. 8D is another perspective view of the combination vale assembly shown in FIG. 8A.
Figure 10:
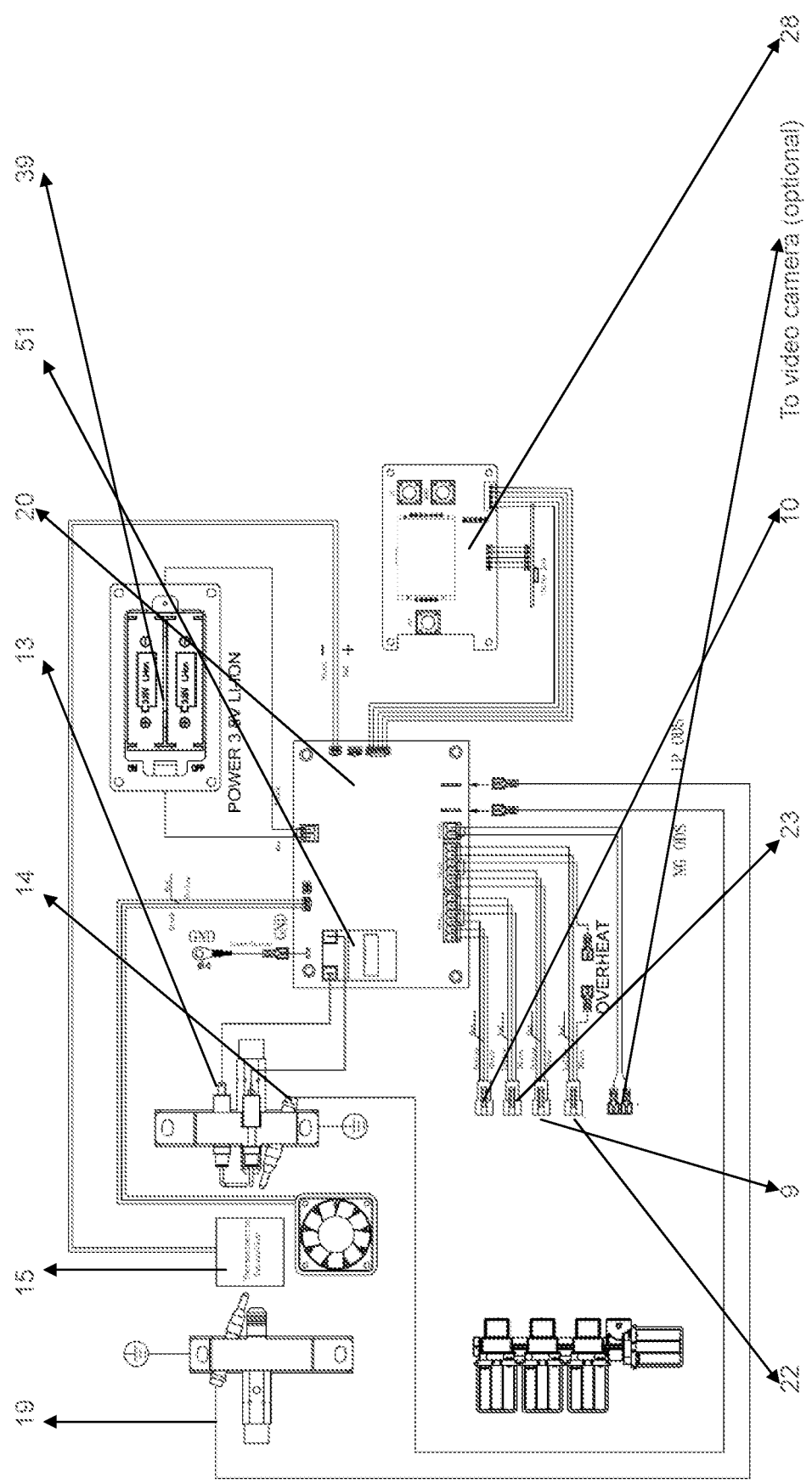
FIG. 10 shows a wiring map of one embodiment of the presently disclosed technology.

The heating system 100 can include at least one main burner 1. Each main burner 1 can be configured to receive fuel through a first inlet or pipe 8 and a second inlet or pipe 7 spaced-apart therefrom (see FIG. 6). A nozzle seat 4 (see FIGS. 3 and 7) can be removably attached to both the first and second inlets 8, 7 to the main burner 1. As shown in FIGS. 6 and 7, a first nozzle 6 can fluidly connect the first inlet 8 to a valve, such as first DC electromagnetic valve 10 (see FIG. 5 and FIG. 10), and a second nozzle 5 can fluidly connect the second inlet 7 to a different valve, such as a second DC electromagnetic valve 9. Both the first and second nozzles 6, 5 can be positioned proximate to an air introductory opening 3 of a fluid passageway 2 (see FIG. 3) within the main burner 1. Any of the electromagnetic vales disclosed herein can be solenoid valves. 5

Figure 4:
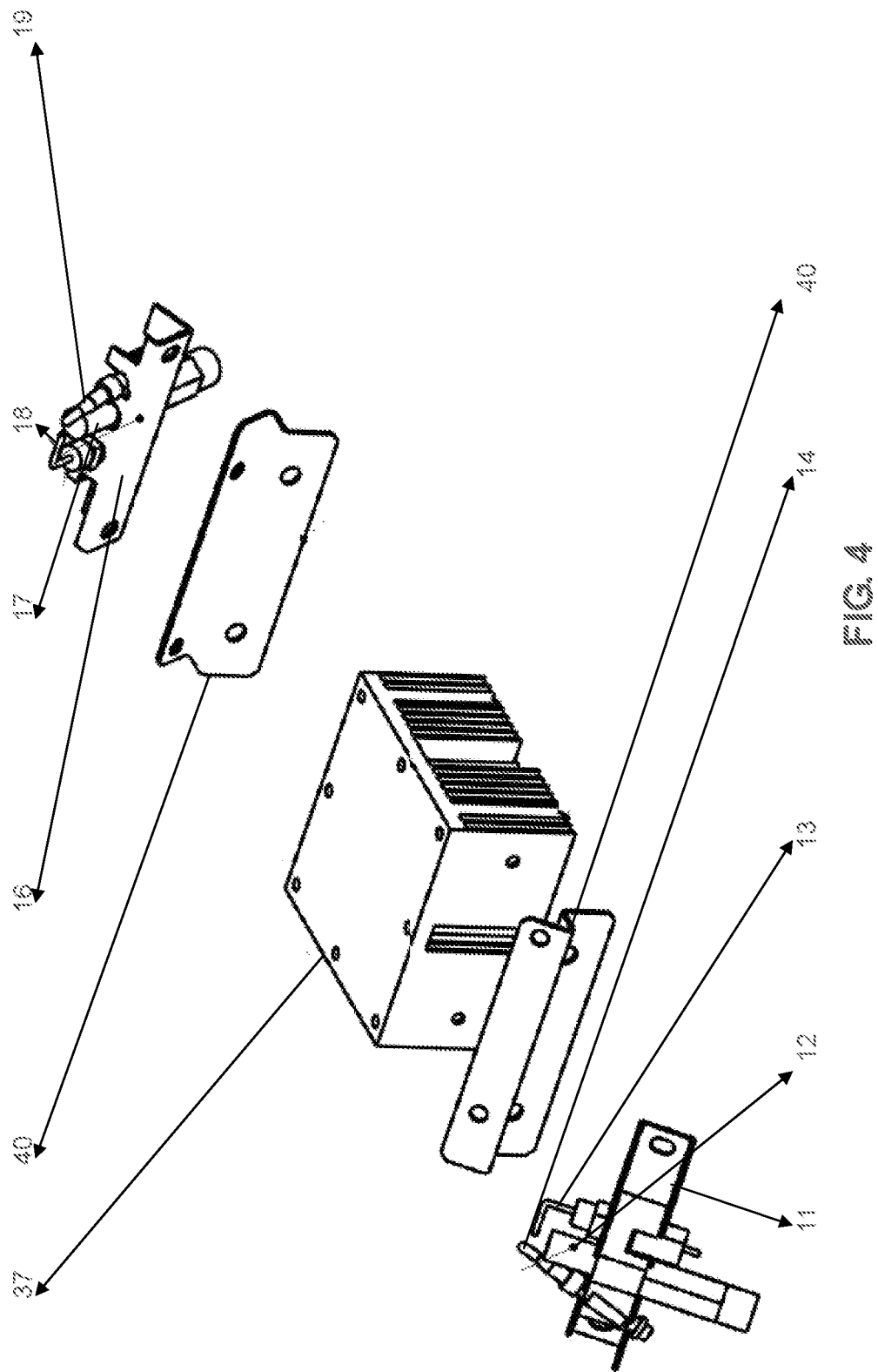
FIG. 4 is a partially exploded view of a pilot burner assembly according to one embodiment of the presently disclosed technology.
Figure 5:
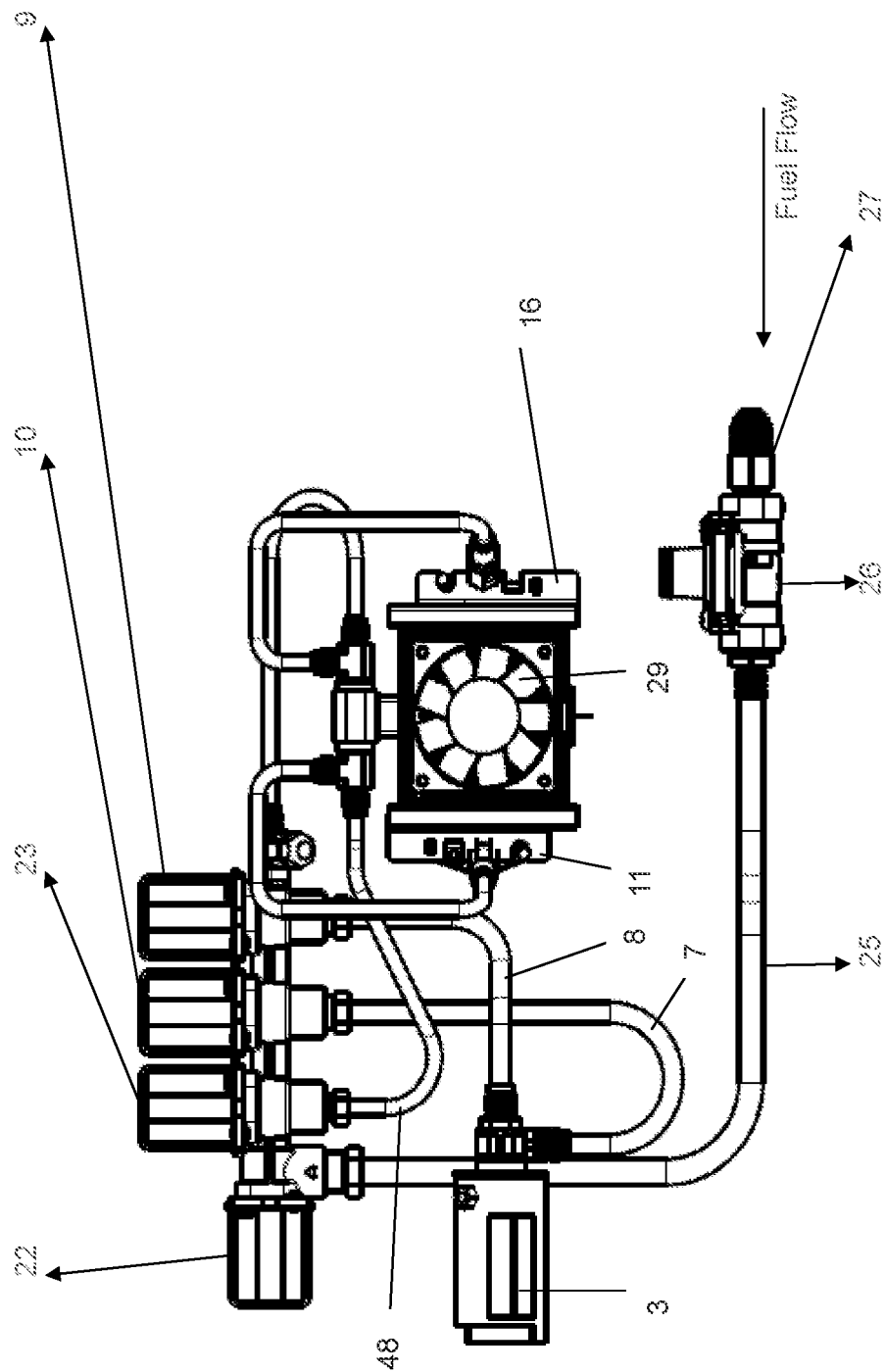
FIG. 5 is a bottom plan view of a piping arrangement according to one embodiment of the presently disclosed technology.

In operation, and as described in detail below, the first inlet or pipe 8 alone can be sized, shaped and/or configured to provide the main burner 1 with a sufficient amount of fuel to generate a desired heat production when the second fuel is supplied. Thus, in at least one embodiment, the second inlet 7 does not provide, or is prevented from providing, any or an appreciable amount of fuel to the main burner 1 when the second fuel is burned. However, the second inlet 7 can be configured to provide the main burner 1 with additional amount of fuel when the first fuel is burned, so that the heat output of the burning system 100 is able to reach the required or expected level. As shown in FIG. 4, a first pilot burner, generally designated 11, can include a first burner 12, a first ignition electrode 13, and at least one first thermocouple 14. The first burner 12, the first ignition electrode 13, and the first thermocouple 14 can be aligned and at least slightly spaced-apart. The first pilot burner 11 can be secured, attached to, and/or part of a thermoelectric generating system 15 (see FIGS. 2, 6 and 9). On another or opposite side of the thermoelectric generating system 15, a second pilot burner, generally designated 16, can be attached thereto. The second pilot burner 16 can include a second burner 17, a second ignition electrode 18 and at least one second thermocouple 19 (see FIGS. 4, 6 and 9). The second burner 17, the second ignition electrode 18, and the second thermocouple 19 can be aligned and at least slightly spaced-apart. In one embodiment, the second ignition electrode 18 can be omitted since ignition can be started from the first pilot burner 11, which can ignite the thermoelectric generating system 15 and then can ignite the second pilot burner 16. In fact, in one embodiment, the thermoelectric generating system 15 can be intended to ignite the main burner(s) 1 too.

In some embodiments, one or both of the first thermocouple 14 and the second thermocouple 19 could be replaced with Fe-ion sensors, or the thermocouple and Fe-sensor can be combined in one embodiment. The first thermocouple 14 and the second thermocouple 19 can be operatively connected to and can communicate with (e.g., send information to) the PCB 20 (see FIG. 2). The PCB could be a computer processing unit (CPU). In an embodiment where components of the system 100 are connected to one another or communicate with one another through wires, those wires are omitted from the figures for the sake of clarity.

In one embodiment, a diameter of an orifice of or inside the first burner 12 (or the first pilot burner 11) can be larger than a diameter of an orifice inside the second burner 17 (or the second pilot burner 16). As a result of the smaller orifice size of the second burner 17, or as a result of some other or additional limiting feature of the second burner 17, in one embodiment the second pilot burner 16 cannot generate a flame when the first fuel with the lower thermal values is burned and/or supplied, while both pilot burners 12, 16 can generate a flame when the second fuel with higher thermal values is burned and/or supplied. These different situations of burning first fuel and second fuel can be detected by the first thermocouple 14 and the second thermocouple 19 (or by the Fe-ion sensor(s)). Feedback can be sent to PCB 20 to determine the gas or fuel types and/or monitor or change operation of the system 100.

A combination valve assembly 21 (see FIG. 6) can include at least one first electromagnetic valve 10 and at least one second electromagnetic valve 9. The first electromagnetic valve 10 can control the flow of both first fuel and second fuel to the main burner 1 through second inlet pipe 7 and the second nozzle 5. The second electromagnetic valve 9 can control the supplemental (or additional or increased) flow of first fuel to the main burner 1. The combination valve assembly 21 can also include a third electromagnetic valve 23 (see FIGS. 5, 6 and 10) that can control the amount or ability of second fuel to flow to the first pilot burner 11 and the thermoelectric generating system 15. In one embodiment, the third electromagnetic valve 23 is at least partially (or completely) open during ignition. In such an embodiment, after ignition and if the PCB 20 detects that the inlet fuel is the first fuel (i.e., having a lower thermo value), the third electromagnetic valve 23 can be maintained in an open position. However, if the PCB 20 detects that the inlet fuel is the second fuel (i.e., having a higher thermo value), the valve 23 can be closed to avoid unexpected high flame on the first pilot burner 11, as well as avoid excess temperature difference. In one embodiment, the third electromagnetic valve 23 can be omitted from the system. A fourth or main safeguard electromagnetic valve 22 (see FIGS. 5, 6 and 10) could be added to improve the safety of the burning appliance 100. The main safeguard electromagnetic valve 22 can be of a manual type installed either outside or inside the burning appliance 100. Alternatively, the main safeguard electromagnetic valve 22 could be of electromagnetic type installed inside the burning appliance 100 and controlled by (e.g., communicate with) the PCB 20.

Each of the first electromagnetic valve 10, the second electromagnetic valve 9, the third electromagnetic valve 23, and the safeguard electromagnetic valve 22 can be biased to a closed position, and can be opened (individually or collectively, as desired or necessary), by the system.

A supply piping assembly, generally designated as 24, (see FIG. 6) can be configured to convey either the first fuel or the second fuel to the combine valve assembly 21. In one embodiment, the supply piping assembly 24 can include at least one fuel fitting 27 (directly or indirectly connected to a fuel source), at least one main gas supply line or pipe 25 and an appliance gas regulator 26, which is capable to receiving either the first fuel or the second fuel. In one embodiment, only one adaptor fitting 27 and only one appliance gas regulator 26 is required to for the system to receive either the first fuel or the second fuel.

The thermoelectric generating system 15 (see FIGS. 6 and 9) can be configured to transfer or transform heat to electricity to maintain the operation of (or provide power to) the main PCB 20 and all other electric related components. In other words, the thermoelectric generating system can supply the necessary electricity to the system, such that no external power supply is necessary. As shown in FIG. 9, the thermoelectric generating system 15 can include a bracket 33 configured to secure the thermoelectric generating system 15 to a body of the burning appliance 100, a heating block 32, configured to receive and accumulate heat, a burner 41 that can be in the shape of a tube (therefore, may be referred to herein as "the tubular burner") and can be configured to generate heat, an upper gasket 34 and a lower gasket 36, both of which can be configured to secure sufficient contact, a thermoelectric generating plate 35 configured to generate electricity when there is a predetermined temperature difference between an upper side and a lower side thereof, a radiator 37 configured to cool the lower side of thermoelectric generating plate 35, a ventilator 39, and a fixing gasket 38. The thermoelectric generating system 15 is not limited to the inclusion of each and every element described above, as one or more of the above components may be omitted from the thermoelectric generating system 15.

The first pilot burner 11 and the second pilot burner 16 can be attached to the thermoelectric generating system 15 by brackets 40 (see FIG. 4) on two opposing sides thereof, and can be configured to ignite the burner 41 (see FIG. 9).

The burner 41 can be secured to a body of the burning appliance 100 by a fixing bracket 46 (see FIG. 9). To ensure that the burner 41 generates the same or approximately the same heat when using the first fuel and second fuel, a similar design to the main burner 1 can be adopted, including a nozzle seat 4 and two nozzles 42, 43 (see FIGS. 3 and 9). As shown in FIG. 6, a third pipe 48 can extend from the third electromagnetic valve 23 and can be connected with a first T-joint 45 (see FIG. 9). One end or portion of the first T-joint 45 can be configured to one-way communicate with the burner 41 through the nozzle seat 4 and nozzle 42 (e.g., second fuel can flow from the third electromagnetic valve 23 to an inlet of the first T-joint 45), while another end or portion of the first T-joint 45 can be configured to communicate with the first pilot burner 11 through a pipe 47. A fourth pipe 49 can extend from the combination valve assembly 21 (and can further communicate with the main safeguard electromagnetic valve 22 directly) and can be connected with a second T-joint 44 (see FIG. 9). One end of the second T-joint 44 can be configured to one-way communicate with the burner 41 through the nozzle seat 4 and nozzle 43 (e.g., first fuel can flow from the combination valve assembly 21 and/or the main safeguard electromagnetic valve 22 to an inlet of the first T-joint 45), while another end or portion of the second T-joint 44 can be configured to communicate with the second pilot burner 16 through pipe 50. Thus, the burner 41 can be kept "always on" when either the first pilot burner 11 or the second pilot burner 16 is on (e.g., producing a flame). In one embodiment, the burner 41 could be only shut off when the PCB 20 closes the main safeguard electromagnetic valve 22.

In one embodiment, the heating block 32, the thermoelectric generating plate 35, the radiator 37 and the ventilator 39 can be fixed together in one axis. Such a design provides several benefits, such as enabling the thermoelectric generating system 15 to have a compact construction, and providing or creating the greatest temperature difference between two faces of the thermoelectric generating plate 35, or more exactly, providing or creating the highest heat-electricity transforming efficiency.

Prior art thermoelectric generating systems need at least a heat medium, such as hot air or hot liquid to absorb and reserve heat, as well as a liquid cooling device to stabilize the temperature difference between the two surfaces of the thermoelectric generating plate 35. In contrast, the presently disclosed technology can use at least one independent gas burner 41 to ensure the temperature difference, and requires no additional heat mediums or a liquid cooling device.

, as mentioned above, the independent gas burner 41 of the presently disclosed technology is designed so that it can use either a first fuel or a second fuel to generate similar temperature difference between the two surfaces of the thermoelectric generating plate.

Thus, the generating systems 15 of the presently disclosed technology can be simply and independently used in any burning appliances, such as heaters and gas cookers, as well as in gas grilling appliances with stable electricity output.

The PCB, generally designated 20, can be configured to operate and monitor the burning appliance 100. A digital panel 28 could be wired or wirelessly connected to the PCB 20 to show and or control the operation of the burning appliance 100. The PCB 20 could be started in any of a variety of ways, such as by battery pack 29 or a smart phone recharger through micro USB port or socket 30. An additional USB port 31 could be added to use surplus electricity to operate other home device like smart phone or radio after the burning appliance 100 being operated. At least one high voltage pack 51 can be either integrally or separately connected with the PCB 15 to generate ignition sparks on the first ignition electrode 14 and the second ignition electrode 19. The system 100 can be designed to communicate or interact with a number of separate devices, such as a wall-mounted thermostat of a room (e.g., through wireless remote control) or a smart phone.

Figure 11:
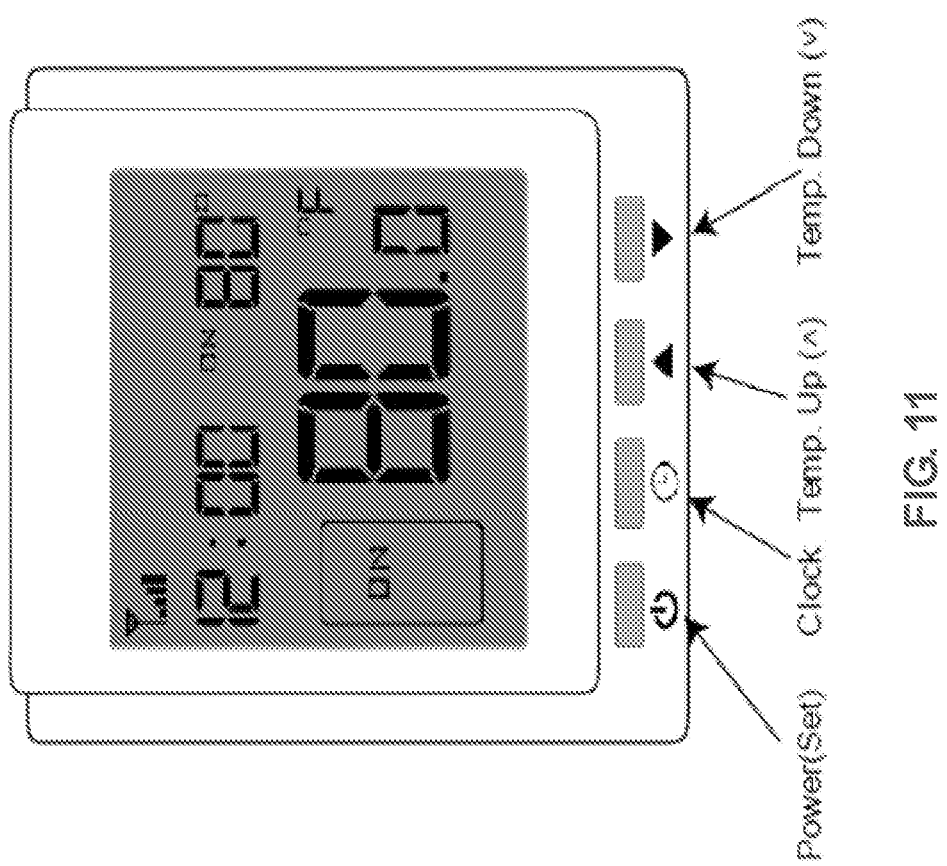
FIG. 11 shows a remote controller according to one embodiment of the presently disclosed technology.

In one embodiment, the digital panel 28 can be equipped with an electronic room temperature thermostat. By pressing one or both of two or more keys 53, 54, desired room temperature can be set and/or adjusted. In certain embodiments, the digital panel 28, if wirelessly connected with WIFI, which is possible in the presently disclosed technology, could be replaced by a smart phone. Furthermore, an additional video camera could be connected with terminal 52. Remote control and monitoring with smart phone is then available. In operation of one embodiment, a remote wall thermostat, as shown in FIG. 11, could be used as well. The digital panel 28 could be of the wireless type or even be replaced by a smart phone for remote control.

In operation of one embodiment, either the first fuel supply or the second fuel supply can be connected with fitting 27, and the valve in fuel line(s) can be opened or closed as desired. A battery can be inserted into or attached to the battery pack 29, or the micro plug of a smart phone recharger can be plugged into socket 30. The SET button 52 on the digital panel 28 can be touched or engaged, such that PCB 20 will then be activated and the ventilator will be turned on. In one embodiment, a predetermined amount of time may be required for the PCB 20 to carry out a self-diagnose. If self-diagnosis proves not to identify an issue or a problem, a high voltage pack can generate ignition sparks on the first pilot burner 11, the main safeguard electromagnetic valve 22 can be opened, the third electromagnetic valve 23 can be opened, either the first fuel or the second fuel can reach the first pilot burner 11, the second pilot burner 12 and the burner 41 of the thermoelectric generating system 15. This ignition process can last for a predetermined amount of time, such as for several (e.g., approximately 7-10) seconds. If the PCB 20 does not detect ignition, it can be configured to shut off the main safeguard electromagnetic valve 22, carry out self-diagnoses again, and repeat the ignition process. If the second ignition fails as well, the PCB 20 can be configured to shut off or close one or all of the valves, can let the ventilator 39 continue to run for a predetermined amount of time, and can send warning signals, and/or display one or more error codes on the display panel 28.

In one embodiment, after a successful ignition when using the first fuel (e.g., natural gas), a flame will be generated by (or on) the first burner 12 of the first pilot burner 11, and the first thermocouple 14 will in turn be sufficiently heated (e.g., due to its proximity and/o sensitivity to the first burner 12) to generate thermoelectric potential (and/or Fe-ion when using a Fe-ion sensor). In this situation (e.g., using the first fuel), on the second burner 17 of the second pilot burner 16, because of the smaller diameter of orifice and the lower thermo value of the first fuel, there will be no flame or a very small flame, such that the second thermocouple 19 is not or cannot be sufficiently heated such that it does not or cannot generate thermoelectric potential (and/or Fe-ion when using Fe-ion sensor) to provide feedback to the PCB 20. At that moment, the burner 41 of the thermoelectric generating system 15 will be ignited by the first pilot burner 11 immediately or at least very quickly. In this situation, since the PCB 20 cannot or does not receive thermoelectric potential from the second thermocouple 19, the PCB 20 will determine to use the first fuel (or determine that only the first fuel is being supplied), open both the first electromagnetic valve 10 and the second electromagnetic valve 9 to let the first fuel through the second pipe 7 and the first pipe 8 so that it reaches the main burner 1, which will be then ignited by the burner 41 of the thermoelectric generating system 15.

In contrast, in one embodiment, after a successful ignition when using the second fuel (e.g., propane), a flame generated by (or on) the first burner 12 of the first pilot burner 11 will be larger (as compared to the flame size described above) because of the high thermo value of the second fuel and the bigger orifice diameter of first pilot burner 11. In this scenario, the first thermocouple 14 will in turn be sufficiently heated to generate thermoelectric potential (and/or Fe-ion when using Fe-ion sensor). On the second burner 17 of the second pilot burner 16, a normal or averaged-sized flame can be or is generated, such that the second thermocouple 19 can be sufficiently heated to generate thermoelectric potential (and/or Fe-ion when using Fe-ion sensor) to provide feedback to PCB 20. At that moment, the burner 41 of the thermoelectric generating system 15 can be ignited by the first pilot burner 11 immediately or very shortly thereafter. After PCB 20 receives thermoelectric potential from the second thermocouple 19, the PCB 20 will determine to use the second fuel (or determine that only the second fuel is being supplied), keep the first electromagnetic valve 10 closed, open the second electromagnetic valve 9 to let the second fuel through the first pipe 8 and the second nozzle 5 to reach the main burner 1, which will be then ignited by the burner 41 of the thermoelectric generating system 15.

In cases of unexpected shut off or depleted oxygen level detected by the PCB 20, the PCB 20 can be configured to close one, some or all of the valves, including the main safeguard electromagnetic valve 22, keep the ventilator 29 for a predetermined amount of time, send one or more warning signals, and/or display one or more error codes on the digital panel 28.

After successful ignition and once in operation for a predetermined amount of time, electricity generated by the thermoelectric generating system 15 can be sufficient to maintain the operation of the burning appliance 100, in some cases without additional fuel. In this case, any battery(ies) or smart phone recharger can be removed. In addition, in certain circumstances, there can be a surplus of electricity generated so as to operate or start some other personal or home appliance, such as a smart phone, radio, dehumidifier, etc. from the USB port 31.

Figure 13:
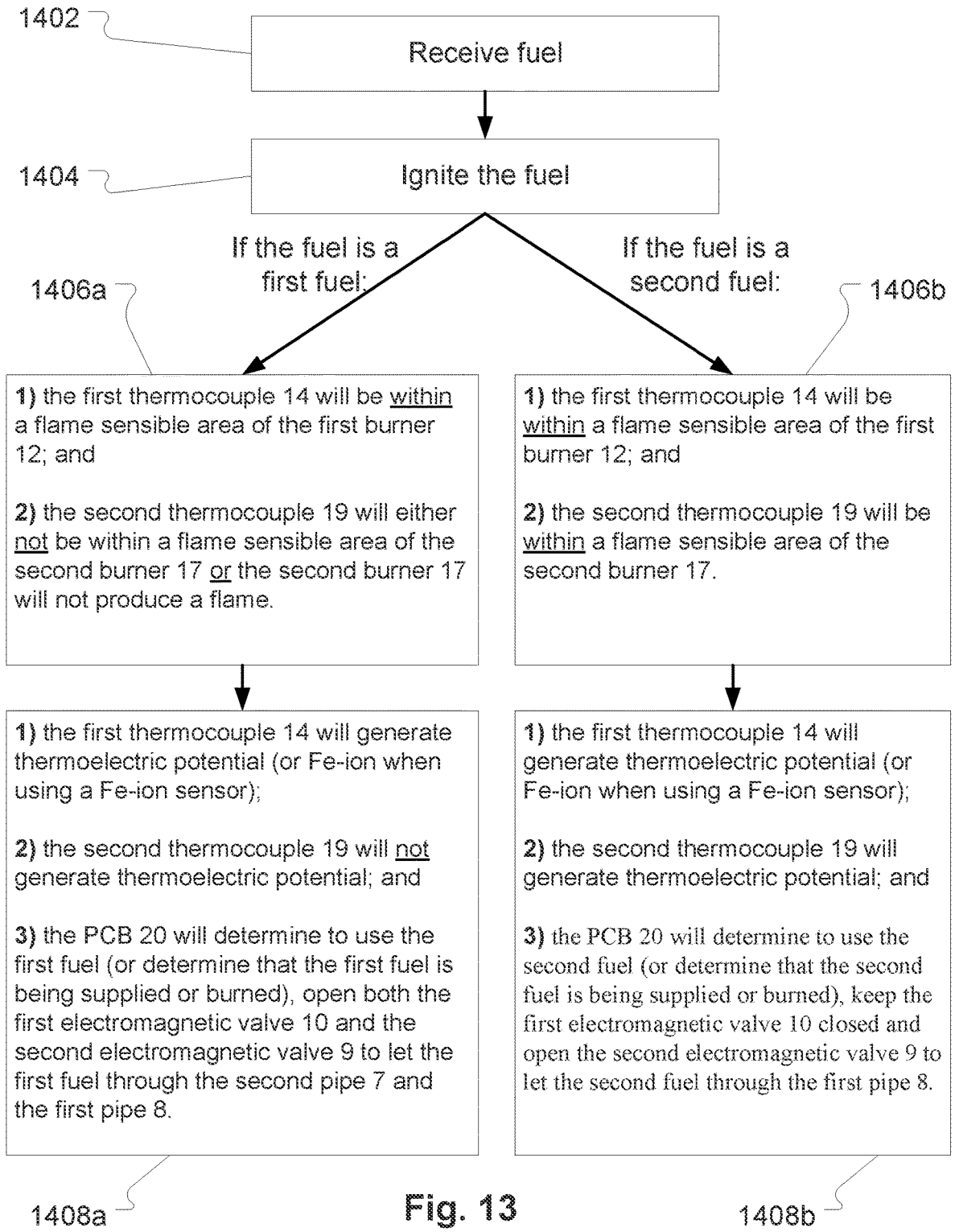
FIG. 13 is a flow diagram of one embodiment of a method of operating the fuel burning system.

FIG. 13 shows one embodiment of a method of operating the fuel burning system 100. The method can include receiving fuel (step 1402) and then igniting the fuel (step 1404). If the fuel is the first fuel, following ignition, the first thermocouple 14 will be within a flame sensible area of the first burner 12 and, therefore, be heated and the second thermocouple 19 is not or cannot be sufficiently heated (step 1406a). As a result of this configuration or set-up, the first thermocouple 14 will generate thermoelectric potential (and/or Fe-ion when using a Fe-ion sensor) and the second thermocouple 19 will not generate thermoelectric potential, such that the PCB 20 will determine to use the first fuel (or determine that the first fuel is being supplied or burned) and open both the first electromagnetic valve 10 and the second electromagnetic valve 9 to let the first fuel through the second pipe 7 and the first pipe 8 (step 1408a).

Conversely, if the supplied fuel is the second fuel, following ignition, the first thermocouple 14 will be within a flame sensible area of the first burner 12 and the second thermocouple 19 will be within a flame sensible area of the second burner 17 (step 1406b). As a result of this configuration or set-up, the first thermocouple 14 will generate thermoelectric potential (and/or Fe-ion when using a Fe-ion sensor) and the second thermocouple 19 will generate thermoelectric potential, such that the PCB 20 will determine to use the second fuel (or determine that the second fuel is being supplied or burned), keep the first electromagnetic valve 10 closed and open the second electromagnetic valve 9 to let the second fuel through the first pipe 8 (step 1408b).

Figure 12:
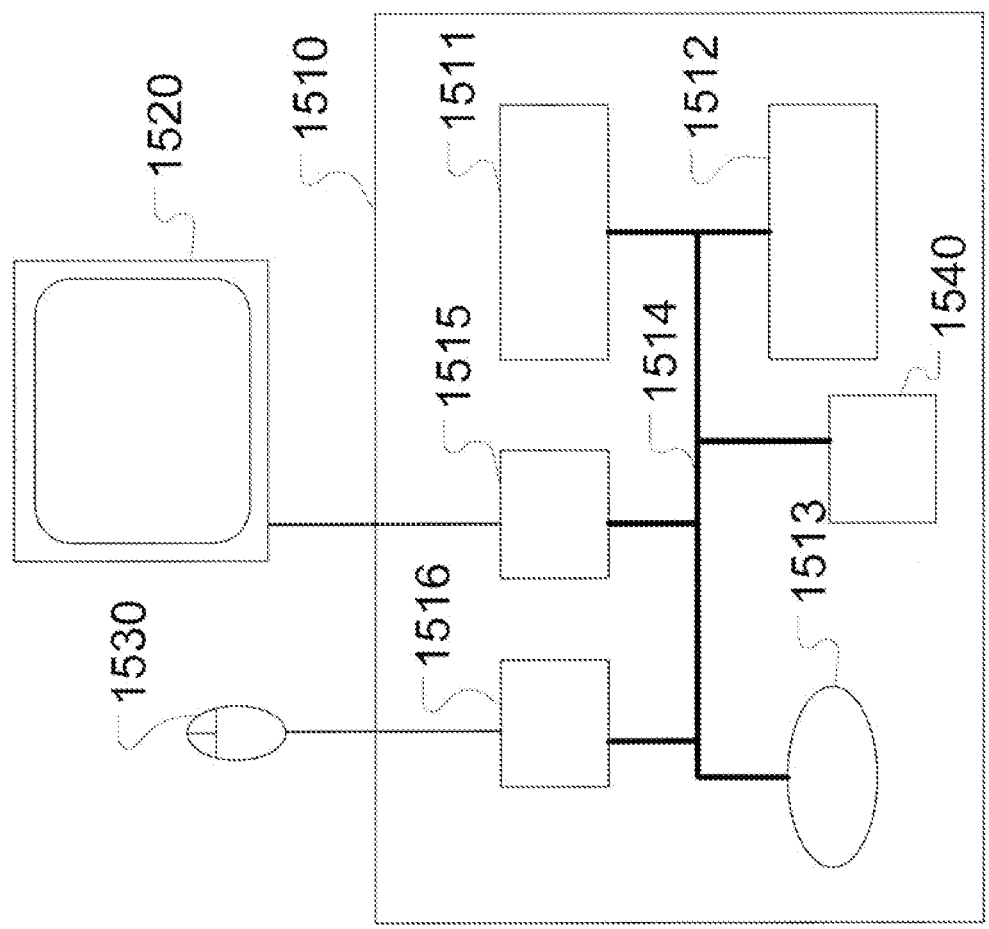
FIG. 12 shows an exemplary computing device useful for performing or initiating processes disclosed herein.

One or more of the above-described systems and/or methods may be implemented with or involve software, for example modules executed on or more computing devices 1510 (see FIG. 12). Of course, modules described herein illustrate various functionalities and do not limit the structure or functionality of any embodiments. Rather, the functionality of various modules may be divided differently and performed by more or fewer modules according to various design considerations.

Each computing device 1510 may include one or more processing devices 1511 designed to process instructions, for example computer readable instructions (i.e., code), stored in a non-transient manner on one or more storage devices 1513. By processing instructions, the processing device(s) 1511 can perform one or more of the steps and/or functions disclosed herein. Each processing device can be real or virtual. In a multi-processing system, multiple processing units can execute computer-executable instructions to increase processing power. The storage device(s) 1513 can be any type of non-transitory storage device (e.g., an optical storage device, a magnetic storage device, a solid state storage device, etc. The storage device(s) 1513 can be removable or non-removable, and include magnetic disks, magnetic tapes or cassettes, CD-ROMs, CD-RWs, DVDs, or any other medium which can be used to store information. Alternatively, instructions can be stored in one or more remote storage devices, for example storage devices accessed over a network or the internet.

Each computing device 1510 additionally can have memory 1512, one or more input controllers 1516, one or more output controllers 1515, and/or one or more communication connections 1540. The memory 1512 can be volatile memory (e.g., registers, cache, RAM, etc.), non-volatile memory (e.g., ROM, EEPROM, flash memory, etc.), or some combination thereof. In at least one embodiment, the memory 1512 can store software implementing described techniques.

An interconnection mechanism 1514, such as a bus, controller or network, can operatively couple components of the computing device 1510, including the processor(s) 1511, the memory 1512, the storage device(s) 1513, the input controller(s) 1516, the output controller(s) 1515, the communication connection(s) 1540, and any other devices (e.g., network controllers, sound controllers, etc.). The output controller(s) 1515 can be operatively coupled (e.g., via a wired or wireless connection) to one or more output devices 1520 (e.g., a monitor, a television, a mobile device screen, a touch-display, a printer, a speaker, etc.) in such a fashion that the output controller(s) 1515 can transform the display on the display device 1520 (e.g., in response to modules executed). The input controller(s) 1516 can be operatively coupled (e.g., via a wired or wireless connection) to an input device 1530 (e.g., a mouse, a keyboard, a touch-pad, a scroll-ball, a touch-display, a pen, a game controller, a voice input device, a scanning device, a digital camera, etc.) in such a fashion that input can be received from a user. The communication connection(s) 1540 enable communication over a communication medium to another computing entity. The communication medium conveys information such as computer-executable instructions, audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

FIG. 12 illustrates the computing device 1510, the output device 1520, and the input device 1530 as separate devices for ease of identification only. However, the computing device 1510, the display device(s) 1520, and/or the input device(s) 1530 can be separate devices (e.g., a personal computer connected by wires to a monitor and mouse), can be integrated in a single device (e.g. a mobile device with a touch-display, such as a smartphone or a tablet), or any combination of devices (e.g., a computing device operatively coupled to a touch-screen display device, a plurality of computing devices attached to a single display device and input device, etc.). The computing device 1510 can be one or more servers, for example a farm of networked servers, a clustered server environment, or a cloud services running on remote computing devices.

It will be appreciated by those skilled in the art that changes could be made to the embodiments described above without departing from the broad inventive concept thereof. For example, the steps or order of operation of the above-described method could be rearranged or occur in a different series, as understood by those skilled in the art. It is understood, therefore, that this disclosure is not limited to the particular embodiments disclosed, but it is intended to cover modifications within the spirit and scope of the present disclosure as defined by the appended claims.

I claim:

1. A system configured to generate heat when supplied with at least one fuel, the system comprising:
a fuel supply line operatively connected to a fuel source, the fuel supply line being configured to convey the at least one fuel;
a valve assembly operatively connected to the fuel supply line, the valve assembly being configured to control a flow of the at least one fuel therethrough;
at least one main burner operatively connected to the valve assembly, the at least one main burner being configured to generate heat; and
a thermoelectric generating system operatively connected to the valve assembly, the thermoelectric generating system being configured to transform heat to electricity and including at least one pilot burner, the at least one pilot burner including at least one flame sensor, wherein the thermoelectric generating system includes:
a thermoelectric generating plate,
a heating block, and
a burner configured to heat the heating block,
wherein the thermoelectric generating plate is disposed on one side of the heating block and is configured to generate electricity when there is a temperature difference between an upper side and a lower side thereof.

2. The system of claim 1, further comprising:
a printed circuit board (PCB) operatively connected to the valve assembly and the at least one pilot burner, the PCB being configured to control operation of the valve assembly based on information received from the at least one pilot burner.

3. The system of claim 2, further comprising at least one Universal Serial Bus (USB) port, the USB port being operatively connected to the PCB, wherein the USB port is configured to provide power to or withdraw power from the PCB.

4. The system of claim 3, further comprising a display operatively connected to the PCB.

5. The system of claim 1, wherein the at least one flame sensor comprises at least one of a thermocouple and a Fe-ion sensor.

6. The system of claim 1, wherein the at least one pilot burner further includes a burner and an ignition electrode.

7. The system of claim 1, wherein the burner of the thermoelectric generating system has a tubular shape, and at least a portion of the burner extends into an interior of the heating block.

8. The system of claim 1, wherein the first valve assembly further comprises a first electromagnetic valve operatively connected to the fuel supply line and a second electromagnetic valve being operatively connected to the fuel supply line, the second electromagnetic valve being spaced-apart from the first electromagnetic valve, a first inlet of the at least one main burner being operatively connected to the second electromagnetic valve, a second inlet of the at least one main burner being operatively connected to the first electromagnetic valve, the at least one main burner receiving the at least one fuel through at the at least one inlet;
wherein the first electromagnetic valve is configured to control flow of the at least one fuel to the main burner through the second inlet, and wherein the second electromagnetic valve is configured to control supplemental flow of the at least one fuel to the at least one main burner.

9. A system configured to generate heat when supplied with at least one fuel, the system comprising:
a fuel supply line operatively connected to a fuel source, the fuel supply line being configured to convey the at least one fuel;
a valve assembly operatively connected to the fuel supply line, the valve assembly being configured to control a flow of the at least one fuel therethrough;
at least one main burner operatively connected to the valve assembly, the at least one main burner being configured to generate heat;
a thermoelectric generating system operatively connected to the valve assembly, the thermoelectric generating system being configured to transform heat to electricity and including at least one pilot burner, the at least one pilot burner including at least one flame sensor, wherein the thermoelectric generating system includes:
a thermoelectric generating plate,
a heating block, and
a burner configured to heat the heating block,
wherein the thermoelectric generating plate is disposed on one side of the heating block and is configured to generate electricity when there is a temperature difference between an upper side and a lower side thereof; and
a printed circuit board (PCB) operatively connected to the valve assembly and the at least one pilot burner, the PCB being configured to control operation of the valve assembly based on information received from the at least one pilot burner.

10. The system of claim 9, wherein the at least one flame sensor comprises at least one of a thermocouple and a Fe-ion sensor.

11. The system of claim 9, wherein the at least one pilot burner further includes a burner and an ignition electrode.

12. The system of claim 9, wherein the burner of the thermoelectric generating system has a tubular shape, and at least a portion of the burner extends into an interior of the heating block.

13. The system of claim 9, further comprising a display operatively connected to the PCB.

14. The system of claim 9, wherein the system further comprises at least one Universal Serial Bus (USB) port, the USB port being operatively connected to the PCB, and wherein the USB port is configured to provide power to or withdraw power from the PCB.

15. The system of claim 9, wherein the valve assembly further comprises a first electromagnetic valve operatively connected to the fuel supply line and a second electromagnetic valve being operatively connected to the fuel supply line, the second electromagnetic valve being spaced-apart from the first electromagnetic valve, a first inlet of the at least one main burner being operatively connected to the second electromagnetic valve, a second inlet of the at least one main burner being operatively connected to the first electromagnetic valve, the at least one main burner receiving the at least one fuel through at the at least one inlet;
wherein the first electromagnetic valve is configured to control flow of the at least one fuel to the main burner through the second inlet, and wherein the second electromagnetic valve is configured to control supplemental flow of the at least one fuel to the at least one main burner.

16. A system configured to generate heat when supplied with at least one fuel, the system comprising:
a fuel supply line operatively connected to a fuel source, the fuel supply line being configured to convey the at least one fuel;
a valve assembly operatively connected to the fuel supply line, the valve assembly being configured to control a flow of the at least one fuel therethrough;
a main burner operatively connected to the valve assembly, the main burner being configured to generate heat, the main burner including at least one inlet, the at least one inlet being operatively connected to the valve assembly;
a tubular burner operatively connected to the valve assembly, the tubular burner configured to generate heat;
a thermoelectric generating system operatively connected to the valve assembly, the thermoelectric generating system being configured to transform heat to electricity, the thermoelectric generating system including:
a main safeguard electromagnetic valve,
an individual electromagnetic valve,
a heating block,
at least one first burner configured to heat the heating block,
a first inlet of the tubular burner being operatively connected to the individual electromagnetic valve,
a second inlet of the tubular burner being operatively connected to the main safeguard electromagnetic valve, and a thermoelectric generating plate,
wherein the thermoelectric generating plate is disposed on one side of the heating block and is configured to generate electricity when there is a temperature difference between an upper side and a lower side thereof; and
a printed circuit board (PCB) operatively connected to the valve assembly and the at least one pilot burner, the pilot burner including at least one flame sensor, the PCB being configured to control operation of the valve assembly based on information received from the at least one pilot burner, the thermoelectric generating system being configured to provide power to the PCB,
wherein the fuel supply line is attached to only one fuel fitting and only one gas regulator.

17. The system of claim 16, wherein the at least one flame sensor comprises at least one of a thermocouple and a Fe-ion sensor.

18. The system of claim 16, further comprising a display operatively connected to the PCB.

19. The system of claim 16, wherein the system further comprises at least one Universal Serial Bus (USB) port operatively connected to the PCB.

20. The system of claim 16, wherein the first burner of the thermoelectric generating system has a tubular shape, and at least a portion of the first burner extends into an interior of the heating block.

* * * * *